United States Patent [19]

Kukanskis

[11] 3,982,045
[45] Sept. 21, 1976

[54] METHOD OF MANUFACTURE OF ADDITIVE PRINTED CIRCUITBOARDS USING PERMANENT RESIST MASK

[75] Inventor: Peter E. Kukanskis, Watertown, Conn.

[73] Assignee: MacDermid Incorporated, Waterbury, Conn.

[22] Filed: Oct. 11, 1974

[21] Appl. No.: 513,994

[52] U.S. Cl. .............................. 427/98; 427/304; 427/305; 427/306; 427/282
[51] Int. Cl.$^2$ ......................................... C23C 3/02
[58] Field of Search .................. 117/47 A, 212, 213; 427/98, 282, 304, 306

[56] References Cited
UNITED STATES PATENTS

| | | | |
|---|---|---|---|
| 3,011,920 | 12/1961 | Shipley | 117/47 A |
| 3,607,352 | 9/1971 | Fadgen et al. | 117/47 A |
| 3,698,940 | 10/1972 | Mersereau et al. | 117/212 |

*Primary Examiner*—Ralph S. Kendall
*Assistant Examiner*—John D. Smith
*Attorney, Agent, or Firm*—St.Onge Mayers Steward & Reens

[57] ABSTRACT

Circuit boards for electronic equipment are produced in which the circuit-forming conductor metal is deposited on a suitably catalyzed and masked resin substrate by all-electroless deposition techniques, wherein the characterizing feature of the invention is the use of a separate acceleration step after catalyzing and prior to application of a resist mask, supplementary of the usual post-masking accelerating step. Improved surface resistivity or insulation resistance in the printed circuit board and improved adhesion of the electrolessly deposited metal are achieved.

6 Claims, No Drawings

METHOD OF MANUFACTURE OF ADDITIVE PRINTED CIRCUITBOARDS USING PERMANENT RESIST MASK

BACKGROUND OF THE INVENTION

U.S. Pat. Nos. 3,620,933, 3,666,549 and 3,698,940 describe novel ways whereby the surface of nonconductive resin substrates are treated to produce a high energy condition such that the substrate can then be readily metal plated by electroless plating techniques, or otherwise bonded to for other purposes. The methods described in these patents are especially useful in the manufacture of printed circuits.

One method, which is called the "totally additive" method, involves catalyzing the entire substrate, drying this catalyzed substrate, and applying an organic polymer resist coating directly on the substrate surface to mask out or define the non-circuit areas where deposition of metal is unwanted. The resulting catalyzed and masked panel is then treated with a dilute acid or base solution to reactivate or accelerate the unmasked circuit areas, and the panel is then electrolessly plated to build up a desired thickness of metal in those unmasked areas.

Although commercially attractive, it was found that problems of low surface resistivity in the finished circuit board arise when using this totally additive process under practical production conditions, following the usual procedure outlined above. Indeed, if the board is catalyzed in a so-called one-step procedure using a mixed tin-palladium chloride solution, then dried and coated with an organic polymer resist in defining the non-circuit areas, and subsequently accelerated and electrolessly plated, poor insulation resistance between electrically isolated conductive metal portions on the finished circuit board can occur.

SUMMARY OF THE INVENTION

It has now been found that, in order to produce by a totally additive process a circuit board which has satisfactory resistivity and which uses an organic polymer resist coating or mask designed to be a permanent part of the finished circuit board, a procedure involving an acceleration step after catalyzing and prior to resist application is uniquely effective.

When the surface of the substrate is catalyzed using any of the commercially available mixed tin-palladium chloride catalyst solutions, various amounts of both tin salts and palladium are adsorbed on the substrate surface depending on the concentration and temperature of the catalyst, the time spent in the catalyst, and preconditioning treatment of the resin substrate. Usually increased temperature, longer immersion time and higher concentration of the catalyst solution tend to leave more catalyst on the surface of the resin substrate. There is of course a minimum amount of catalyst needed on the substrate surface in order to get electroless metal deposition to occur, and this minimum amount is usually achieved easily by immersing the substrate into the catalyst solution under the given set of parameters specified by the suppliers of the commercial catalyst solutions. The now-catalyzed substrate containing tin salts and palladium on the surface would, prior to this invention, be dried and the polymeric or other resist or masking material applied directly over the catalyzed surface to define the non-circuit areas. This resist can "lock in" the catalyst components on the substrate beneath it, and it is postulated that the thus-entrapped tin salts under the resist contribute substantially to lowering the surface resistivity of the laminate and the insulation resistance between electrically independent conductor paths of the finished circuit board.

Accordingly, it is an objective of this invention to introduce an added process step in which there is employed an accelerating solution after catalyzing and prior to the application of a resist coating, whereby to remove tin salts before they are entrapped by the resist coating. This is supplementary of the conventional acceleration step after application and curing of the resist coating, which conventional accelerating step is still retained in the process to reactivate the palladium in the exposed circuit areas, after which the board is then electrolessly plated.

By employing the teaching of this invention, further advantage is usually obtained in the form of some increase in adhesion to and greater ease of initial coverage of electroless metal on the resin substrate. Here again it is postulated that this improvement may possibly be due to the fact that, when the resist is cured, which is usually done at temperatures in excess of 250°F for up to 1 hour, some tin salts on the exposed circuit areas of boards, not processed in accordance with this invention, become oxidized to less soluble forms. As such, they may become more difficult to remove in subsequent accelerating solutions. If they are not adequately removed (a condition called "under acceleration"), it would appear that they could act an interfering boundary layers, making it more difficult for deposition of metal from electroless plating baths, and could also prevent the electroless metal from making intimate contact with the substrate, which is essential for good adhesion.

The solutions used as supplemental accelerators in the practice of this invention are the same as those commercially available for the normal accelerating step. These are usually acids or alkalis of various dilutions with water, for example hydrochloric acid, sulfuric acid, fluoroboric acid, perchloric acid, sodium hydroxide, potassium hydroxide and lithium hydroxide. Others are available and in general all are characterized by ability to solubilize tin salts. Some work better than others, since some have higher limits as to amount of tin salt they can dissolve, while others are more preferential in their ability to remove tin salts faster than palladium. Palladium of course is desired to be retained on the surface of the substrate to act as the catalytic seed for electroless metal deposition; the tin salts are however considered as "poisons".

Several examples utilizing the concept of this invention are given below. In general these procedures are illustrative of presently known best methods of practicing the invention. It will be obvious, however, that details of operation can be changed, once the basic concept is grasped, without departing from the scope of the invention.

PREPARATION OF PRINTED CIRCUIT BOARDS

In this procedure, a starting aluminum-clad epoxy resin laminate is prepared in accordance with the teaching of U.S. Pat. Nos. 3,620,933 and 3,666,549, in which a thin metal cladding of aluminum foil having an anodically treated surface is bonded to a resin substrate by heat and pressure with the anodized surface abutting the resin. The aluminum sheet or foil may be as thin as practical to enable it to be handled in the laminating operation, since this cladding metal will not be used for circuit-forming purposes but is chemically stripped or etched completely from the board prior to application of any conductive circuit thereto. Where the cladding metal is aluminum, suitable stripping etchants are hydrochloric acid or sodium hydroxide solutions. The starting laminates are immersed in such stripping solution until all trace of laminated metal is removed. Following the stripping of the aluminum cladding, the substrate is catalyzed in a procedure using a mixed tin-palladium chloride solution, of which several are commercially available. The exact physical and chemical characteristics of such solutions are not well understood, but it results from mixing tin (II) chloride and palladium (II) chloride in certain concentrations and under certain conditions. Examples of procedures and conditions for preparing such catalyzing solutions are disclosed in various U.S. patents, including U.S. Pat. Nos. 3,532,518, 3,011,920, 3,672,923, 3,672,938 and 3,682,671. The resulting catalyzing solutions differ in some respects but all are operative in the practice of this invention. After the board is catalyzed by immersing it in this solution, it is rinsed and immersed in an accelerator solution of a suitable acid or alkali in accordance with the present invention, preliminary to the application of a resist coating. The board is next rinsed and dried, and a suitable resist coating is applied in selected areas of desired pattern configuration to prevent deposition of electroless metal on non-circuit or unwanted areas. The resist coating is cured if the type selected so requires, after which the board is again subjected to the conventional accelerator solution, using again a dilute solution of suitable acid or alkali, to regenerate the catalytic activity of the resin substrate in the exposed (circuit forming) areas. The board is now electrolessly plated with metal as desired until the total conductor thickness is deposited, after which it is rinsed, dried and baked at approximately 250° to 300°F for about an hour.

Finished circuit boards using this invention procedure exhibit a greater surface resistivity and insulation resistance between conductor paths. They also show some improvement in adhesion of electroless metal to substrate, along with a greater ease of initial coverage of the electroless metal to the substrate.

Further details embodying the currently best known method of practicing the invention are given in the examples below.

EXAMPLE I

An aluminum-clad board is prepared as described in U.S. Pat. Nos. 3,620,933 and 3,666,549, or is obtained from commercial sources utilizing the teachings of those patents. The clad board is optionally cleaned of any surface grime by a mild detergent solution. In this example, a paper-epoxy substrate commonly referred to as FR-3 board is used. The board is dipped or otherwise contacted with an aluminum etching solution to completely strip the anodically treated aluminum cladding from its surface, the etching solution used in this case consisting of a 10% hydrochloric acid solution at approximately 80° to 100°F. The exposed resin surface is next catalyzed, using a palladium catalyst system that is described in the above mentioned U.S. Pat. No. 3,532,518. The board is rinsed and, as taught by this invention, immersed in an accelerator solution which in this instance consisted of a 10% by volume solution of fluoroboric acid. This supplemental accelerating operation is maintained for 2 minutes at ambient temperature, after which the board is rinsed and dried. A conventional permanent type resist coating of organic polymer material is applied to the catalyzed surface to define and cover areas of the board not desired to be plated. A choice of several methods in the selection and application of the resist coating, all of which are known in the art, can be used. The board is next reimmersed in an accelerator solution, either of the same composition as before or a different one, to regenerate the catalytic activity in the areas not covered by resist. After rinsing, the board is electrolessly plated to the desired thickness with nickel and/or copper using any of the commercially available electroless metal plating solutions. The thickness of electroless metal deposit is from about 1 mil to 1.5 mils for most commercial applications and is adequate for the purposes of this invention.

After plating is completed, the board is rinsed, dried, and baked in an oven at about 250° to 300°F. for 1 hour.

Upon cooling, the board was tested for surface resistivity and insulation resistance. The tests employed are well known in the printed circuit industry and are described in Military Specifications MIL-P-55110 and MIL-P-13949. The resistivity values obtained ranged from 1 million to 10 million megohms under the prescribed test conditions.

Adhesion tests carried out on the sample show an average peel strength value of 11 to 12 pounds per inch.

EXAMPLE II (PRIOR ART)

The same procedure is followed as in Example I, however in this case no supplemental accelerating step as taught by this invention is used after catalyzation and before masking. Instead, the heretofore standard procedure is followed of immediately rinsing and drying the catalyzed board, then applying the resist coating. After coating, the board was accelerated in the normal manner and then electrolessly plated, rinsed and baked, all as before.

Substantially poorer surface resistivity or insulation resistance were observed in this case than in the prior example. The values ranged from around 500 to 1000 megohms, and the adhesion of metal to substrate showed a peel strength of from about 9 to about 9½ pounds per inch.

This example illustrates the heretofore standard procedure, and the substantially different results are believed to be caused by the effect of locking in the catalyst components under the resistive coating, as previously discussed.

EXAMPLE III

The same procedure as in Example I was followed in this case, but different substrates were employed. Examples were made using commercial FR-2, FR-4 and FR-6 printed circuit board substrates, these being respectively phenolic base, fiberglass cloth-epoxy and random glass fiber-epoxy substrate materials. No significant differences in results from those obtained in Example I were noted.

EXAMPLE IV

Again the same procedure as in Example I was followed, except that the substrate used was an FR-4 board and instead of the sacrificial metal clad surface preparation procedure the bare board was subjected to a pre-catalyzing organic solvent treatment as described in Example I of U.S. Pat. No. 3,698,940. Again the resulting values obtained were directly comparable to those of the foregoing Example I in this disclosure.

EXAMPLE V

A series of tests was run using the procedure of Example I but substituting different supplemental accelerator solutions. Specifically the solutions employed were 10% hydrochloric acid, 10% sulfuric acid, 20% perchloric and a sodium hydroxide solution containing 5 grams per liter of alkali. Again the results obtained in respect to surface resistivity and adhesion were directly comparable with those of Example I above.

What is claimed is:

1. In the plating of a non-conductive substrate by an all-additive electroless plating process wherein the process includes the usual steps in sequence of treating the substrate surface with a precious metal catalyst solution to produce sites catalytic to the reduction thereon of a metal from an electroless metal plating solution, applying a permanently retained resist mask to portions of the catalytically activated surface to define a desired pattern resistive to deposition of electroless metal, accelerating the substrate surface by treatment in a dilute acid or alkali solution to reactivate the unmasked catalyzed areas, and then electrolessly plating the substrate in a reducing solution of the metal to be plated to provide the total desired thickness of metal deposit on the substrate, the improvement in such process which comprises: subjecting the substrate to another accelerating step in dilute acid or alkali solution subsequent to catalyzation but prior to application of the permanent resist mask, whereby to increase the surface resistivity between plated areas of the substrate and improve the plated metal adhesion.

2. The improved process defined in claim 1, wherein the pre- and post-masking accelerating solutions are of the same composition.

3. The improved process defined in claim 1, wherein said catalyst solution is a mixed tin-palladium chloride solution and both accelerating solutions are dilute fluoroboric acid solutions.

4. The improved process defined in claim 1, wherein the non-conductive substrate is a phenolic, paper reinforced phenolic, epoxy or fiber glass reinforced epoxy member.

5. The improved process defined in claim 1, wherein the accelerating solutions are aqueous solutions of about 10% hydrochloric acid, 10% sulfuric acid, 20% perchloric acid, 10% fluoroboric acid or 5% sodium hydroxide.

6. The improved process defined in claim 1, wherein said substrate is immersed in said other accelerating solution at ambient temperature for about 2 minutes.

* * * * *